United States Patent [19]
Trotel

[11] 3,989,975
[45] Nov. 2, 1976

[54] ION BOMBARDMENT APPARATUS
[75] Inventor: Jacques Trotel, Paris, France
[73] Assignee: Thomson-CSF, Paris, France
[22] Filed: May 13, 1975
[21] Appl. No.: 577,107

[30] Foreign Application Priority Data
May 15, 1974 France .............................. 74.16874

[52] U.S. Cl. ............................. 313/231.3; 313/360;
313/153; 313/162
[51] Int. Cl.² ........................................ H01J 17/26
[58] Field of Search ................ 313/359, 360, 231.3,
313/153, 162

Primary Examiner—Robert Segal
Assistant Examiner—Darwin R. Hostetter
Attorney, Agent, or Firm—Cushman, Darby & Cushman

[57] ABSTRACT

An apparatus with an increased efficiency, for ion bombardment machining operations at voltages not exceeding some few thousands of volts, is provided. It comprises an ion source whose plasma is extracted across grids forming cylinders of revolution about one and the same axis, for example a vertical axis. The specimens for machining are arranged in a ring around the ion source. The ion beam, of radial type, is highly uniform within a cylindrical space defined between two parallel planes, for example horizontal planes. It is possible to limit the apertural angle of the beam by the use of a mask arranged against one of the grids.

5 Claims, 3 Drawing Figures

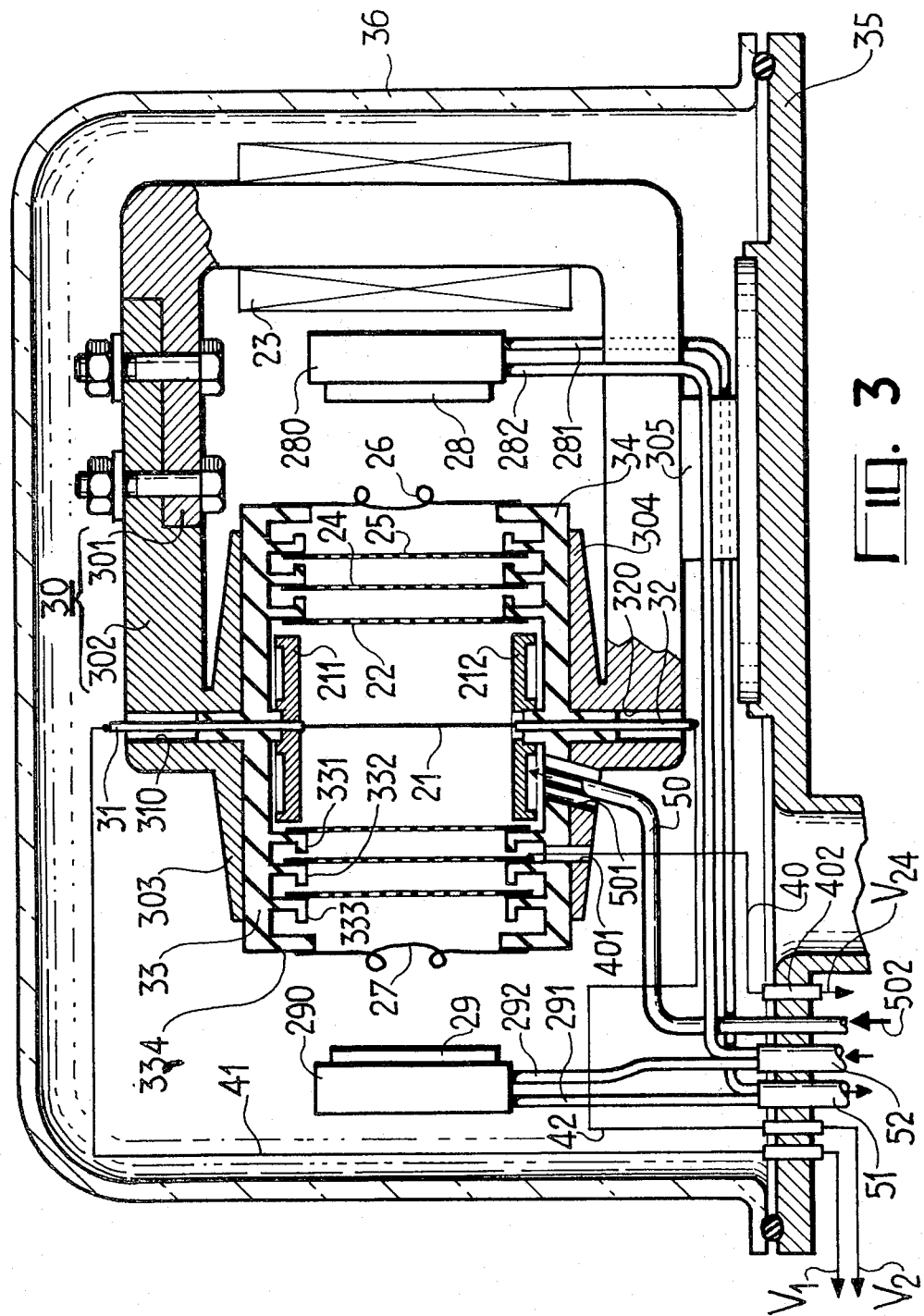

ION BOMBARDMENT APPARATUS

The present invention relates to an ion bombardment apparatus, in particular of the kind used to pulverize the material of a specimen by means of ions which have been accelerated with the help of a voltage of no more than a few thousand volts. The phenomenon is then limited to superficial pulverizing of the specimen and this makes it possible:

either to abrade a very fine superficial layer which could not have been removed by other methods without damaging the underlying material;
or to adjust the thickness of a semi-conductor specimen without destroying its crystalline structure;
or to deposit particles which have been detached by ion bombardment, as in cathode sputtering, upon a substrate arranged in the neighbourhood of the specimen, beyond the zone which is directly subjected to the ion beam.

The known kinds of apparatus produce ion beams of relatively small cross-section and it is generally attempted to restrict beam dispersion in order to increase the bombardment density and to limit the target zone to a generally small area. The result is that normally only one specimen at a time can be dealt with.

The object of the present invention is to increase the cross-section of the ion beam without reducing its intensity.

According to the invention, there is provided an ion bombardment, comprising:

an ion source, comprising:
a cathode comprising a rectilinear heater filament, capable of emitting electrons in all directions perpendicular to itself, and two circular discs centered on said filament and perpendicular to said filament and
an anode, constituted by a first cylindrical grid surrounding said cathode;
a set of cylindrical grids, constituted by a second and a third grids, capable of extracting and accelerating the ions produced by said ion source, arranged around said anode;
a series of filaments parallel to said heater filament and arranged in a ring around said set of cylindrical grids;
a series of mounts for accommodation of specimens to be treated.

The invention will be better understood and other of its features rendered apparent from a consideration of the ensuing description and the drawings in which latter:

FIG. 3 is a schematic section through an apparatus in accordance with the invention operating on the same principle as that shown in FIG. 2.

Figure 1:
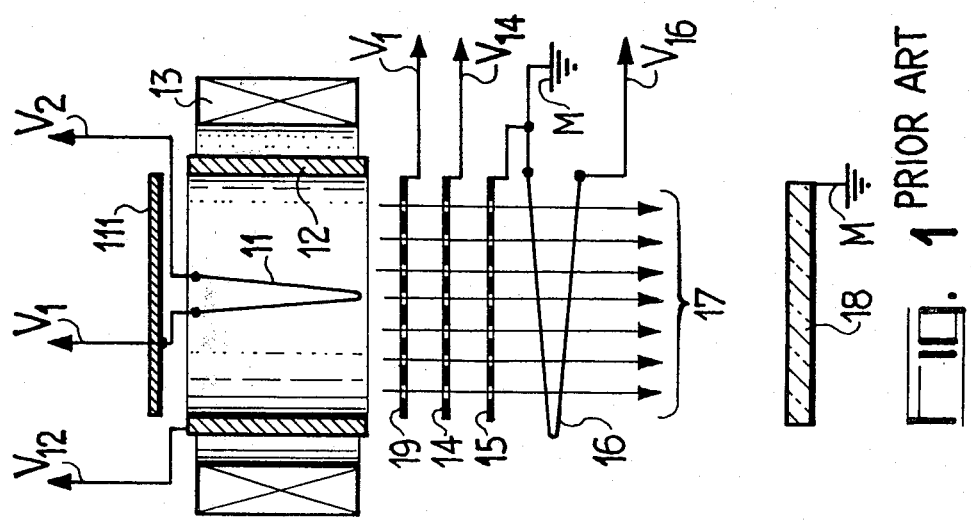
FIG. 1 is a schematic section through a known ion bombardment apparatus.

FIG. 1 illustrates in a schematic section an example of a known ion bombardment apparatus. An ion source comprises a heater filament 11 doing duty as an electron-emissive cathode, a metal cylinder 12 doing duty as anode and an electromagnetic coil 13 which creates a direct magnetic field aligned along the axis of the cylinder 12. The assembly is arranged in an evacuated vessel (not shown) and supplied with argon by means of a device which introduces the gas at a very low flow rate but which has not been shown. Three grids 14, 15 and 19 and a second heater filament 16 are arranged between the ion source and the location at which a specimen 18, which has been earthed, is to be placed, the assembly being disposed along the axis of revolution of the cylinder 12. The grid 19, on the one hand, and a disc 111 on the other, electrically connected to one end of the filament 11, terminate the anode cylinder 12. The current supply for the filaments, and the voltage supply for the other electrodes, are effected from direct sources operating at the following potentials:

. $V_{12}$ (1040 volts) for the anode 12;
. $V_{14}$ (−200 volts) for the grid 14;
. zero potential (earth M) for the grid 15;
. $V_{16}$ (10 volts) for one end of the filament 16, the other end being taken to the earth M;
. $V_1$ (1000 volts) and $V_2$ (1005 volts) for the ends of the filament 11, in order to ensure a so-called discharge voltage of around 40 volts between anode and cathode.

The grid 19 is at the potential $V_1$.

The operation of the ion source is well known per se: those skilled in the art will be aware that a plasma of positive ions is formed inside the cylinder 12. The disc 111 and the grid 19 limit this plasma. The grids 14 and 15 help to extract the ions and to accelerate them. The grid 14, which is placed at a negative potential, constitutes, in association with the grid 15 which is earthed, a deceleration space which reflects electrons emitted by the filament 16. These electrons indeed are unwanted in the plasma region; by contrast, in the zone of the ion beam (arrows 17), they reduce the space charge and prevent beam dispersion.

Figure 2:
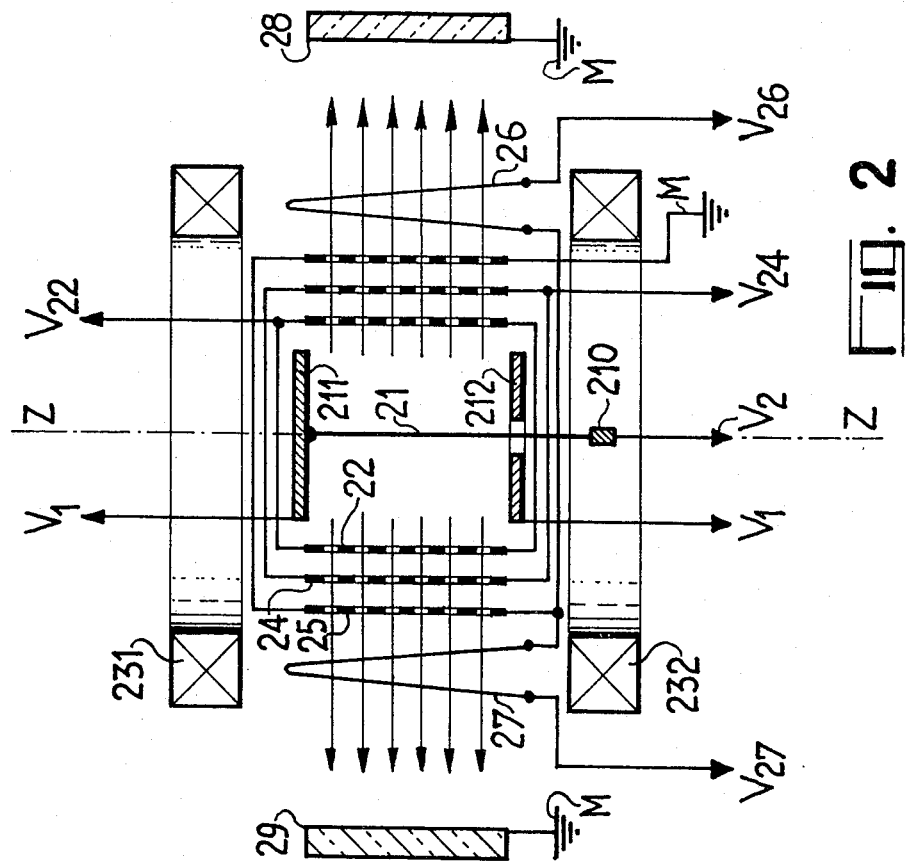
FIG. 2 is a schematic section through an apparatus in accordance with the invention.

FIG. 2 schematically shows an embodiment of the invention. There can be seen there in section, as in FIG. 1, the various elements of an ion source and a system of grids for ion extraction purposes. However, the shape of the elements and especially the geometry of the beam obtained, are radically different. The filament which heats the ion source is arranged on an axis ZZ, for example a vertical axis, this representing an axis of revolution for the ion source and for the grids. The filament will for example be a tungsten filament 21 stretched between a metal disc 211 and a stud 210. Another metal disc 212, parallel to that 211 and of the same diameter thereas, contains a central hole to pass the filament 21. The discs 211 and 212 are at the same potential $V_1$ (1000 volts for example) and the stud 210 at the potential $V_2$ (1005 volts for example). The plasma from the ion source is comprised between the discs 212 and 211 on the one hand, and on the other hand limited by a cylindrical anode containing numerous holes and therefore illustrated as a grid 22. This anode is supplied with a direct voltage $V_{22}$ of 1040 volts for example.

Two electro-magnetic coils 231 and 232 arranged at either side of the ion source proper, also have as their axis of revolution, the axis ZZ.

Around the anode 22 there are successively arranged:
a grid 24 with an axis of revolution ZZ and supplied with a direct voltage $V_{24}$ (−200 volts);
a grid 25 similar to that 24 but taken to the earth M;

a series of filaments arranged parallel to the axis ZZ and forming a ring around the aforesaid grid; two of these filaments, 26 and 27, have been illustrated, these being located in the plane of FIG. 2; each of them has one end earthed and other end supplied with a direct voltage of 10 volts ($V_{26}$, $V_{27}$).

Specimens for treatment, such as those illustrated at 28 and 29 in the plane of the figure, are also arranged in a ring around the filaments.

The principle of operation is identical in the case of the apparatus of both FIGS. 1 and 2. However, in the case of the invention, the ions are extracted uniformly at the periphery of the anode and the beam is able to bombard with uniform intensity a target surface occupying the internal surface of a cylinder of revolution comprised between the planes of the discs 211 and 212.

FIG. 3 is a more detailed schematic section of the apparatus of FIG. 2. The elements which perform the same functions in FIGS. 2 and 3, have been marked by the same references.

A magnetic circuit 30, supplied by an electro-magnetic coil, can be split into two parts 301 and 302 in order to facilitate the assembly of the ionizaton source. It rests upon a base 305 carried by a platform 35 designed to receive an evacuated vessel 36. The U-shaped circuit, comprises two fairly wide polepieced 303 and 304, which embrace the ion source. The latter, at its centre, comprises the filament 21 which is identical to that shown in FIG. 2 but is this time welded to two metal rods 31 and 32 passing through passages 310 and 320 formed in the polepieces. The rod 31 carries a disc 211, the latter, at its centre, carrying a sleeve designed to facilitate welding of the rod to the disc. The rod 32 is separate from the disc 212 which contains a large central opening and is held in position by an insulating component 34.

The anode 22, the grids 24 and 25 and the filaments 26 and 27 are held in position for example by means of two insulating components 33 and 34 penetrating into the passages 310 and 320 and traversed by the rods 31 and 32. These insulators take the form of discs with concentric circular protrusions such as those 331, 332 and 333 in the case of the insulator 33. To the internal edges of these spigots the anode and grid cylinders are welded. The grids are constituted by multiply perforated plates folded to give them a cylindrical shape. The external edges of the spigots carry lips designed to protect the interior of the grooves thus formed, against the unwanted effects of metal deposition arising from the phenomenon of cathode sputtering (pulverizaton of the grids by the ion beam).

The supply leads for the electrodes attached to the insulators 33 and 34, have not been shown except in the case of one of them (the lead 40 for the grid 24) in respect of which, by way of example, FIG. 3 shows a section through a leadthrough passage 401 passing through the components 304 and 34. The lead 40 transmits the potential of $V_{24}$ to the grid 24, successively across an insulated leadthrough 402 (passing through the platform 35) and the leadthrough passage 401.

The rods 31 and 32 are placed at the potentials $V_1$ and $V_2$ by the leads 41 and 42. The lead which places the disc 212 at the same potential as the rod 31, has not been shown.

The very low flow rate argon supply is effected through tubing 50 which, from a distribution system (arrow 502) passes through a passage 501 formed in the component 304 and extends up to the ion source.

The specimens for treatment, such as the substrates 28 and 29, are placed upon mounts comprising cooling arrangements (280, 290). The input (281, 291) and return (282, 292) lines for the cooling fluid, are connected inside the vessel 36, with general piping arrangements (51, 52) passing through the base 35.

By way of example, an ion flow in excess of 200 milliamps has been measured, namely twenty times better than in the conventional apparatus, when using the following design parameters:

| | | |
|---|---|---|
| Internal diameter of anode grid | 100 | mm |
| Height of anode grid | 100 | mm |
| Diameter of grid holes | 3 | mm |
| Grid spacing | 1 or 3 | mm |
| Grid thickness | 1 | mm |
| Cathode : diameter of tungsten filament : | 0,6 | mm |
| Cathode heating current : | 15 or 20 | A |
| Discharge voltage : | 40 | volts |
| Discharge current : | 2 | A |
| Cathode potential : | 960 | V |
| Anode potential : | 1000 | V |
| Extraction grid potential : | 0 | V |

It is possible to reduce the ion flow and consequently the pumping flow rate which the evacuated vessel requires, if only a small number of specimens are being treated, by installing a mask e.g. a metal screen covering part of the cylinder constituted by one of the electrodes of the ion source.

What I claim is:
1. An ion bombardment apparatus comprising:
   a chamber for containing an inert gas at a selected pressure;
   an ion source, comprising:
      a cathode comprising a rectilinear heater filament, extending linearly, capable of emitting electrons in all directions perpendicular to itself, and two circular discs centered on said filament and perpendicular to the direction of extension of said filament
   an anode, constituted by a first cylindrical grid surrounding said cathode;
   a set of cylindrical grids, constituted by a second and third grids, capable of extracting and accelerating the ions produced by said ion source, arranged around said anode;
   a series of filaments parallel to said heater filament and arranged in a ring around said set of cylindrical grids; and
   a series of mounts for accommodation of specimens to be treated.
2. An ion bombardment apparatus as claimed in claim 1, wherein said ion source, said set of cylindrical grids and said series of filaments are arranged between the polepieces of an electro-magnet comprising a magnetic circuit which can be split in order to insert insulators designed for the accommodation of said ion source, said grids and said filaments.
3. An ion bombardment apparatus as claimed in claim 2, wherein said insulators take the form of discs equipped with concentric circular protrusions, said protrusions possessing lips designed to protect the interiors of the grooves formed between the protrusions, against the effects of cathode sputtering.
4. An apparatus as claimed in claim 1, wherein means are provided for masking a part of the cylinder constituted by one of the cylindrical grids contained in said apparatus.
5. An apparatus as claimed in claim 1, wherein said inert gas is argon.

* * * * *